US010285269B2

(12) United States Patent
Yosui

(10) Patent No.: US 10,285,269 B2
(45) Date of Patent: May 7, 2019

(54) MULTILAYER SUBSTRATE AND MANUFACTURING METHOD FOR THE MULTILAYER SUBSTRATE

(71) Applicant: Murata Manufacturing Co., Ltd., Nagaokakyo-shi, Kyoto-fu (JP)

(72) Inventor: Kuniaki Yosui, Nagaokakyo (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 434 days.

(21) Appl. No.: 14/845,349

(22) Filed: Sep. 4, 2015

(65) Prior Publication Data
US 2015/0382464 A1  Dec. 31, 2015

Related U.S. Application Data

(63) Continuation of application No. PCT/JP2014/070005, filed on Jul. 30, 2014.

(30) Foreign Application Priority Data

Sep. 6, 2013 (JP) ................................. 2013-184664

(51) Int. Cl.
*H05K 1/16* (2006.01)
*H05K 1/11* (2006.01)
(Continued)

(52) U.S. Cl.
CPC ............. *H05K 1/115* (2013.01); *B32B 7/03* (2019.01); *B32B 7/04* (2013.01); *B32B 27/08* (2013.01); *B32B 27/281* (2013.01); *B32B 27/285* (2013.01); *B32B 27/286* (2013.01); *B32B 37/02* (2013.01); *B32B 37/06* (2013.01); (Continued)

(58) Field of Classification Search
CPC ...................................................... H05K 3/4694
See application file for complete search history.

(56) References Cited

U.S. PATENT DOCUMENTS

2004/0229024 A1  11/2004  Harada et al.
2004/0264837 A1  12/2004  Ogawa
(Continued)

FOREIGN PATENT DOCUMENTS

JP            4-35092 A      2/1992
JP       2004-146602 A       5/2004
(Continued)

OTHER PUBLICATIONS

Official Communication issued in International Patent Application No. PCT/JP2014/070005, dated Sep. 9, 2014.

*Primary Examiner* — William P Watkins, III
(74) *Attorney, Agent, or Firm* — Keating & Bennett, LLP

(57) ABSTRACT

A multilayer substrate is manufactured by first manufacturing a first substrate by stacking and hot-pressing resin base materials of the first substrate and then adjacently stacking and hot-pressing the first substrate and resin base materials that constitute a second substrate at a position overlapping with each other in a stacking direction. The position in the stacking direction between the resin base materials in the first substrate is located at almost a middle position in the stacking direction of a resin base material of the second substrate, and is different from the position between the layers of the resin base materials of the second substrate.

10 Claims, 9 Drawing Sheets

(51) Int. Cl.

| | | |
|---|---|---|
| *H05K 3/46* | (2006.01) |
| *B32B 37/06* | (2006.01) |
| *B32B 37/10* | (2006.01) |
| *H05K 1/02* | (2006.01) |
| *H05K 1/03* | (2006.01) |
| *H05K 3/06* | (2006.01) |
| *H05K 3/12* | (2006.01) |
| *B32B 37/02* | (2006.01) |
| *B32B 37/18* | (2006.01) |
| *B32B 7/04* | (2019.01) |
| *B32B 27/08* | (2006.01) |
| *B32B 27/28* | (2006.01) |
| *B32B 7/03* | (2019.01) |

(52) U.S. Cl.
CPC ........... *B32B 37/10* (2013.01); *B32B 37/182* (2013.01); *H05K 1/0237* (2013.01); *H05K 1/0353* (2013.01); *H05K 3/06* (2013.01); *H05K 3/1216* (2013.01); *H05K 3/4632* (2013.01); *H05K 3/4644* (2013.01); *H05K 3/4694* (2013.01); *B32B 2250/24* (2013.01); *B32B 2255/10* (2013.01); *B32B 2255/205* (2013.01); *B32B 2457/08* (2013.01); *H05K 3/4617* (2013.01); *H05K 3/4697* (2013.01); *H05K 2201/0141* (2013.01); *H05K 2201/0154* (2013.01)

(56) References Cited

U.S. PATENT DOCUMENTS

2006/0180344 A1\* 8/2006 Ito ................... H01L 23/5385
                                                174/262
2009/0283312 A1    11/2009  Takahashi

FOREIGN PATENT DOCUMENTS

| JP | 2004-311627 A | 11/2004 |
|---|---|---|
| JP | 2009-289805 A | 12/2009 |
| WO | 2009/141928 A1 | 11/2009 |
| WO | 2013/168539 A1 | 11/2013 |

\* cited by examiner

MULTILAYER SUBSTRATE AND MANUFACTURING METHOD FOR THE MULTILAYER SUBSTRATE

BACKGROUND OF THE INVENTION

1. Field of the Invention

The present invention relates to a multilayer substrate including a stack of a plurality of resin base materials formed of thermoplastic resin, and also relates to a manufacturing method for the multilayer substrate.

2. Description of the Related Art

There has been known a multilayer substrate in which a plurality of resin base materials formed of thermoplastic resin are stacked and bonded by heating and pressurization (see, for example, Japanese Unexamined Patent Application Publication No. 2004-311627).

In the above-described multilayer substrate of Japanese Unexamined Patent Application Publication No. 2004-311627, wiring patterns are individually formed on the resin base materials, and the resin base materials are then stacked and bonded to configure a high-frequency circuit.

In the multilayer substrate of Japanese Unexamined Patent Application Publication No. 2004-311627, the resin base materials are disposed all over the multilayer substrate in plan view. That is, the resin base materials of the layers are provided over the entire area of the multilayer substrate in plan view, and the stack number and the position between the layers are constant over the entire area of the multilayer substrate.

Further, there has hitherto been a demand to more densely form wiring patterns in the stacking direction only in one part of a multilayer substrate than in the other part or to change the positions of wiring patterns in the stacking direction only in one part of the multilayer substrate.

However, in the multilayer substrate of the related art described in Japanese Unexamined Patent Application Publication No. 2004-311627, the stack number and the position between the layers cannot be made partially different. In accordance with a part where the stack number is the largest, the stack number and the position between the layers of the resin base materials in the other part are determined inevitably. Hence, the flexibility in design is low. Specifically, for example, when the capacitance of a capacitor is to be increased by decreasing the opposed interval of the wiring patterns in one part and the occurrence of stray capacitance is to be suppressed by increasing the opposed interval of the wiring patterns in the other portion, since the stack number and the position between the layers cannot be made partly different, the stack number and the position between the layers cannot be separately optimized in the parts. Further, in accordance with the part where the largest stack number is required, the stack number of resin base materials in the other part is determined. Hence, the stack number sometimes becomes larger than necessary with respect to the positions of wiring patterns in the other part. At this time, when there is a need to connect wiring patterns provided on different layers (there is a need to connect the layers), the number of connecting portions using via conductors increases more than necessary, and conductivity of connection between the layers is apt to decrease.

SUMMARY OF THE INVENTION

Accordingly, preferred embodiments of the present invention provide a multilayer substrate having high flexibility in design and a manufacturing method for the multilayer substrate.

In a multilayer substrate according to a preferred embodiment of the present invention, a plurality of resin base materials made of a same thermoplastic resin are stacked. The multilayer substrate includes a first substrate including a plurality of first resin base materials of the plurality of resin base materials, and a second substrate including a plurality of second resin base materials of the plurality of resin base materials. The first substrate and the second substrate are adjacently disposed at a position overlapping with each other in a stacking direction of the plurality of resin base materials, a first position between first resin base materials in contact with each other and a second position between second resin base materials in contact with each other are different in the stacking direction, and a side surface and a bottom surface of the first substrate are welded to the second substrate.

In the multilayer substrate according to a preferred embodiment of the present invention, the stack number and the position between the layers is partly different because the position between the layers of the first substrate and the position between the layers of the second substrate are at different positions in the stacking direction. This increases the flexibility in design. Thus, for example, even when the capacitance of a capacitor is to be increased by decreasing the opposed interval of wiring patterns in one portion and the occurrence of stray capacitance is to be significantly reduced or prevented by increasing the opposed interval of the wiring patterns in the other portion, the stack number and the position between the layers is able to be separately optimized in the individual portions. Further, even when the wiring patterns are more densely provided in the stacking direction only in one portion than in the other portion, the stack number is prevented from increasing more than necessary in the other portion. Hence, when there is a need to connect wiring patterns provided on different layers, the number of connecting portions using via conductors is prevented from increasing more than necessary. As a result, conductivity of connection between the layers is prevented from decreasing.

By adjacently disposing the first substrate and the second substrate made of a same thermoplastic resin, one portion (first substrate) of the multilayer substrate is able to be prepared (for example, purchased or manufactured) separately from the other portion (second substrate), and is able to be easily combined with the other portion. Thus, for example, even when high-accuracy base materials (high-quality base materials having little variation in thickness and permittivity) and a process capable of forming wiring patterns and so on with high accuracy (for example, photolithography) are required only in one portion of the multilayer substrate, base materials and a process that satisfy the high accuracy requirement are able to be used only in the portion. It is unnecessary to use base materials and a process that satisfy the high accuracy requirement in the other portion in accordance with the portion. That is, in the other portion where high accuracy is not required, lower-quality base materials and a simpler process are able to be used than in the portion where high accuracy is required. This reduces the manufacturing cost. For example, if the distance between the layers or the accuracy of wiring patterns differs among individual substrates, the distance between the wiring patterns, the opposed area, and so on vary among the individual substrates, and the electric characteristics become uneven. In contrast, according to the structure of a preferred embodiment of the present invention, only in a portion where variations in electric characteristics is to be particularly suppressed, high-quality resin base materials having little variation in thickness preferably are used, or wiring patterns are formed by using a high-accuracy process so as to significantly reduce or prevent the increase in total manufacturing cost of the substrate while satisfying the high accuracy requirement for the portion. Further, since the resin base materials are made of a same kind of thermoplastic resin, the resin base materials are able to be combined by an easy process using hot pressing, and peeling and wire breakage resulting from the difference in thermal expansion coefficient rarely occur. Since the physical property is uniform or substantially uniform, design is easy.

In the multilayer substrate according to a preferred embodiment of the present invention, the stack number of the plurality of first resin base materials may be different from the stack number of the second resin base materials adjacent to the first substrate, of the plurality of second resin base materials.

When the stack number is made different in this way, the minimum necessary stack number with respect to the wiring patterns is able to be set in each of the first substrate and the second substrate. Hence, the number of portions of connection between the layers is reduced. Further, for example, when an inductor is provided in a portion where the stack number is large, the number of turns of the inductor is easily increased.

The first substrate is able to be more firmly and securely fixed by being encased in the second substrate. Further, the principal surface of the multilayer substrate is preferably shaped like a flat surface having no irregularities, and this allows for easy surface mounting.

In a multilayer substrate according to a preferred embodiment of the present invention, the first substrate and the second substrate may be electrically joined through a via conductor. In this case, when the plurality of second resin base materials that constitute the second substrate and the first substrate are bonded by hot pressing, the via conductor (conductive paste) in the second resin base materials is metalized. Since interfaces between the wiring pattern in the first substrate and the via conductor in the second substrate are thus firmly and securely bonded, peeling is prevented.

Further, in a multilayer substrate according to a preferred embodiment of the present invention, the first substrate may define at least a portion of a high-frequency filter circuit. While high accuracy is often required in a portion that defines the high-frequency circuit, only the first substrate that defines at least a portion of the high-frequency filter circuit is able to be manufactured to satisfy high accuracy requirement. Hence, a high-accuracy high-frequency filter circuit is obtained while preventing any increase in total manufacturing cost of the multilayer substrate.

A multilayer substrate according to a preferred embodiment of the present invention is manufactured preferably by first stacking and hot-pressing first resin base materials to manufacture a first substrate and then adjacently stacking and hot-pressing the first substrate and second resin base materials, as in the following steps (1) to (4):

(1) a first stacking step of stacking a plurality of first resin base materials of a plurality of resin base materials;

(2) a first heat and pressure bonding step of manufacturing a first substrate by bonding the plurality of first resin base materials in a stacked state by heating and pressurization;

(3) a second stacking step of stacking at least one of a plurality of second resin base materials of the plurality of resin base materials to be adjacent to the first substrate at a position to overlap with each other in a stacking direction of the plurality of resin base materials; and (4) a second heat and pressure bonding step of manufacturing a second substrate by bonding the first substrate and the plurality of second resin base materials in a stacked and adjacent state by heating and pressurization, and welding a side surface and a bottom surface of the first substrate to the second substrate.

When the first substrate defines at least a portion of the high-frequency filter circuit, as described above, preferably, a relatively high-accuracy process (for example, photolithography) is used in a first wiring-pattern forming step of forming a wiring pattern in the first substrate, and a relatively low-accuracy process (for example, screen printing) is used in a second wiring-pattern forming step of forming a wiring pattern in the second substrate.

According to various preferred embodiments of the present invention, it is possible to increase the flexibility in design of the multilayer substrate.

The above and other elements, features, steps, characteristics and advantages of the present invention will become more apparent from the following detailed description of the preferred embodiments with reference to the attached drawings.

DETAILED DESCRIPTION OF THE PREFERRED EMBODIMENTS

Figure 1A:
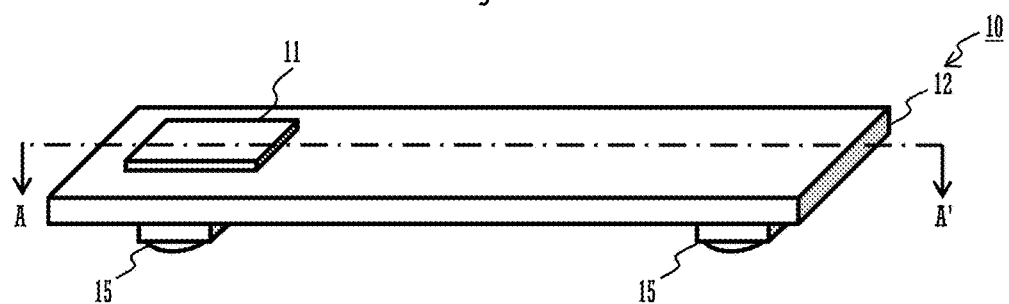
FIGS. 1A and 1B are a perspective view and a cross-sectional side view, respectively, of a multilayer substrate according to a preferred embodiment of the present invention.
Figure 1B:
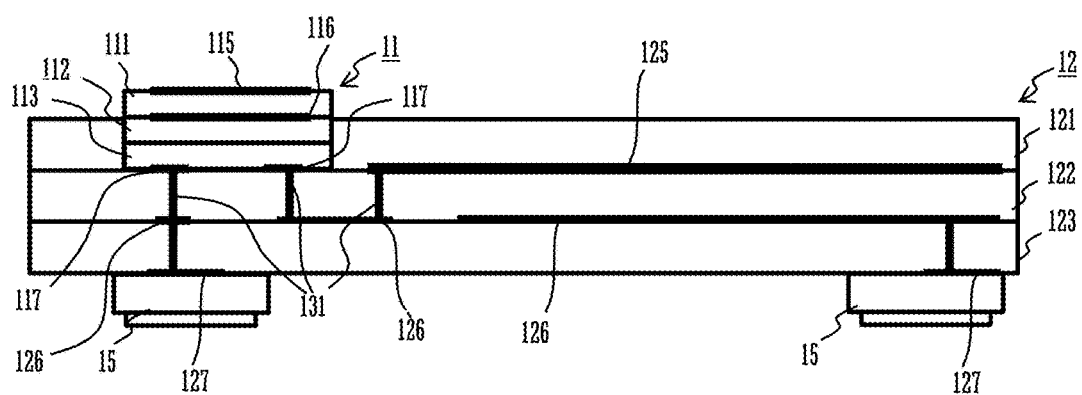

Multilayer substrates according to preferred embodiments of the present invention will be described below. FIG. 1A is a perspective view of a multilayer substrate 10 according to a preferred embodiment of the present invention. FIG. 1B is a cross-sectional side view of the multilayer substrate 10, taken along line A-A' of FIG. 1A.

The multilayer substrate 10 includes a first substrate 11, a second substrate 12, and terminals 15. The terminals 15 are disposed on a lower surface (lower principal surface) of the second substrate 12. The principal surfaces of the second substrate 12 have a larger area than the principal surfaces of the first substrate, and the second substrate 12 preferably has a rectangular or substantially rectangular parallelepiped shape that extends in elongated manner in one direction in plan view.

The first substrate 11 includes a stack of a resin base material 111, a resin base material 112, and a resin base material 113. These resin base materials 111, 112, and 113 are an example of a first resin base material. The second substrate 12 includes a stack of a resin base material 121, a resin base material 122, and a resin base material 123. These resin base materials 121, 122, and 123 are an example of a second resin base material.

The resin base material 111, the resin base material 112, and the resin base material 113 preferably are made of the same kind of thermoplastic resin. For example, the thermoplastic resin preferably is a liquid crystal polymer resin. The kinds of thermoplastic resin other than the liquid crystal polymer resin are, for example, PEEK (polyetheretherketone), PEI (polyetherimide), PPS (polyphenylenesulfide), and PI (polyimide), and these may be used instead of the liquid crystal polymer resin.

The resin base material 121, the resin base material 122, and the resin base material 123 are also preferably made of the same kind of thermoplastic resin. For example, the thermoplastic resin preferably is a liquid crystal polymer resin. Therefore, the first substrate 11 and the second substrate 12 are made of the same kind of thermoplastic resin, and the multilayer substrate 10 includes a stack of a plurality of resin base materials made of the same kind of thermoplastic resin.

The first substrate 11 and the second substrate 12 are adjacently disposed at a position to overlap with each other in a stacking direction of the resin base materials. In this preferred embodiment, the resin base material 112 and the resin base material 113 in the first substrate 11 are disposed adjacently to the resin base material 121 in the second substrate 12. That is, the first substrate 11 is fixed to the second substrate 12 by being fitted in a cutout portion (cavity) provided in the resin base material 121 that defines an upper surface (upper principal surface) of the second substrate 12 and stacked on an upper surface of the resin base material 122.

The resin base material 111 in the first substrate 11 includes a wiring pattern 115 on its upper surface. The resin base material 112 includes a wiring pattern 116 on its upper surface. The resin base material 113 includes a wiring pattern 117 on its lower surface.

The resin base material 121 in the second substrate 12 includes a wiring pattern 125 on its lower surface. The resin base material 122 includes a wiring pattern 126 on its lower surface. The resin base material 123 includes a wiring pattern 127 on its lower surface. The wiring pattern 127 is an electrode that connects the terminals 15.

The wiring pattern 117 is connected to the wiring pattern 126 through via conductors 131 provided in the resin base material 122. Thus, the first substrate 11 and the second substrate 12 are electrically joined through the via conductors 131.

Such a multilayer substrate 10 is manufactured preferably by first stacking and hot-pressing the resin base materials in the first substrate 11 to form the first substrate 11, then adjacently stacking the first substrate 11 and the resin base materials of the second substrate 12, and hot-pressing the first substrate 11 and the second substrate 12 again.

Figure 2A:
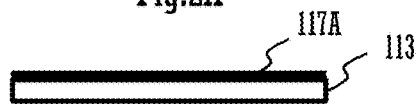
FIGS. 2A to 2G illustrate a manufacturing method for a first substrate according to a preferred embodiment of the present invention.

FIGS. 2A to 2G illustrate a non-limiting example of a manufacturing method for the first substrate 11. First, the manufacturing method for the first substrate 11 includes a step of preparing a resin base material, as illustrated in FIG. 2A. The resin base material is prepared by cutting out a portion having the required area from a resin sheet having a conductor foil (for example, copper) that is stuck all over one surface thereof beforehand. In this preferred embodiment, a resin base material 113 with copper foil 117A stuck on one surface preferably is prepared.

Figure 2B:
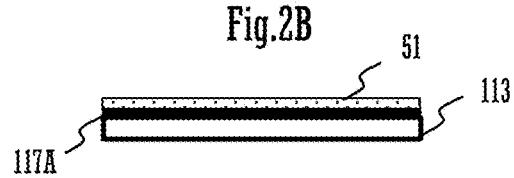
Figure 2C:
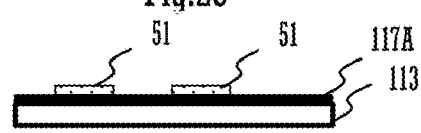
Figure 2D:
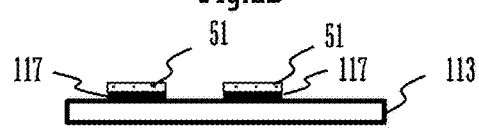
Figure 2E:
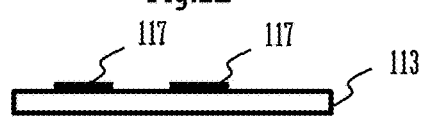

Next, a wiring pattern 117 is formed by patterning the copper foil 117A. In this preferred embodiment, photolithography is preferably used as a process for forming the wiring pattern 117. That is, as illustrated in FIG. 2B, a resist 51 is applied all over the surface of the resin base material 113 on which the copper foil 117A is stuck, and is exposed by using a mask corresponding to the wiring pattern. Then, portions of the resist 51 other than a portion corresponding to the wiring pattern are removed by development, as illustrated in FIG. 2C. Then, as illustrated in FIG. 2D, portions of the copper foil 117A other than the portion corresponding to the wiring pattern are removed by etching. Finally, the resist 51 is removed to form a wiring pattern 117.

Figure 2F:
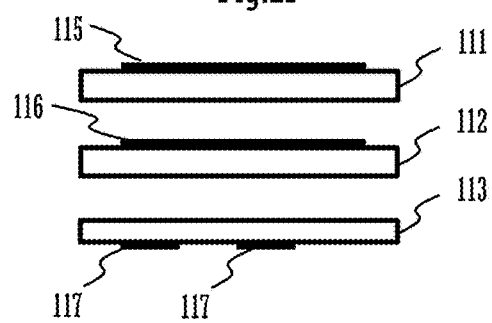

Similar steps are performed for a resin base material 111 and a resin base material 112, and a wiring pattern 115 and a wiring pattern 116 are formed on the resin base material 111 and the resin base material 112, respectively. Then, as illustrated in FIG. 2F, the resin base material 111, the resin base material 112, and the resin base material 113 are stacked (this is an example of a first stacking step). While the wiring pattern 117 is disposed on the upper side for explanation in FIGS. 2A to 2E, it is disposed on the lower side at the time of stacking, as illustrated in FIG. 2F.

Figure 2G:
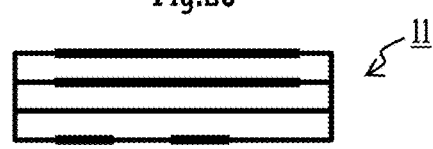

Finally, as illustrated in FIG. 2G, heating and pressurization are performed by a heating press (this is an example of a first heat and pressure bonding step). In this way, the resin base materials are temporarily pressure-bonded (temporarily bonded) to define a first substrate 11. Although not illustrated, the wiring patterns on the resin base materials are electrically connected through via conductors. In the hot pressing of FIG. 2G, as the via conductors, conductor paste filled in through holes in the resin base materials (holes formed by a carbon gas laser or the like to penetrate only the resin base materials) are temporality joined.

Then, the first substrate 11 and the resin base materials of the second substrate 12 are adjacently stacked at a position to overlap with each other in the stacking direction of the resin base materials and are subjected to hot pressing, such that a multilayer substrate 10 is manufactured.

First, steps of preparing resin base materials in the second substrate 12 will be described with reference to FIGS. 3A to 3F. FIGS. 3A to 3F illustrate a step of preparing a resin base material 122.

Figure 3A:
FIGS. 3A to 3F illustrate a step of preparing second resin base materials according to a preferred embodiment of the present invention.

As illustrated in FIG. 3A, a resin base material 122 is prepared by cutting out a portion having the required area from a resin sheet having conductor foil (for example, copper) 126A stuck all over one surface thereof beforehand.

Figure 3B:
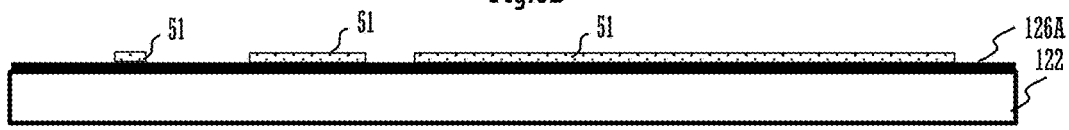

Next, a predetermined wiring pattern is formed in the copper foil 126A. In this preferred embodiment, screen printing is preferably used as a process for forming the wiring pattern. That is, as illustrated in FIG. 3B, a resist 51 is printed on a portion corresponding to the wiring pattern on the surface of the resin base material 122 on which the copper foil 126A is stuck.

Figure 3C:
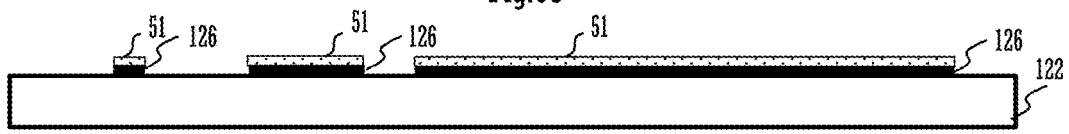
Figure 3D:

After that, as illustrated in FIG. 3C, portions of the copper foil 126A other than the portion corresponding to the wiring pattern are removed by, for example, etching. Finally, as illustrated in FIG. 3D, the resist 51 is removed to form a wiring pattern 126.

Similar steps are performed for a resin base material 121 and a resin base material 123, and a wiring pattern 125 and a wiring pattern 127 are formed on the resin base material 121 and the resin base material 123, respectively.

Figure 3E:
Figure 3F:
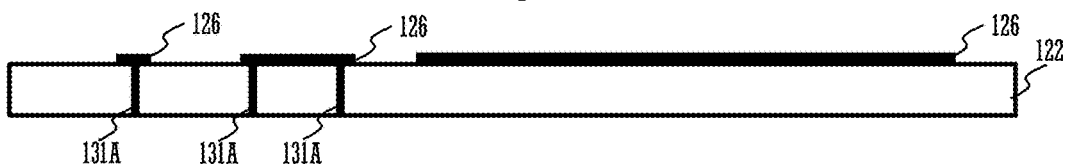

Through holes 53 are formed in portions of the resin base material 122, for example, by a carbon gas laser, as illustrated in FIG. 3E, and the through holes 53 are then filled with conductive paste 131A, as illustrated in FIG. 3F.

Figure 4A:
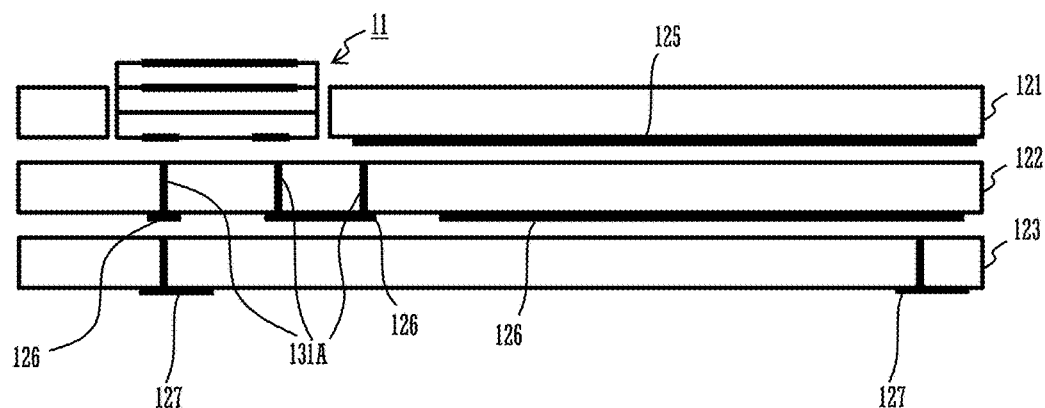
FIGS. 4A and 4B illustrate a step of stacking the first substrate and the second resin base materials according to a preferred embodiment of the present invention.

Then, as illustrated in FIG. 4A, the resin base material 121, the resin base material 122, and the resin base material 123 are stacked (this is an example of a second stacking step). Here, the first substrate 11 is fitted in a cutout portion (cavity) provided in the resin base material 121, and is stacked on an upper surface of the resin base material 122. That is, the first substrate 11 is disposed and stacked adjacently to the resin base material 121. Since the first substrate 11 is joined to the second substrate 12 at a side surface and a bottom surface by being fitted in the cavity, the joint strength is increased. Further, since a side surface of the cavity defines and functions as a guide, the accuracy of the position where the first substrate 11 is disposed is increased.

While the wiring pattern 126 is disposed on the upper side for explanation in FIGS. 3A to 3F, it is disposed on the lower side at the time of stacking, as illustrated in FIG. 4A.

Figure 4B:
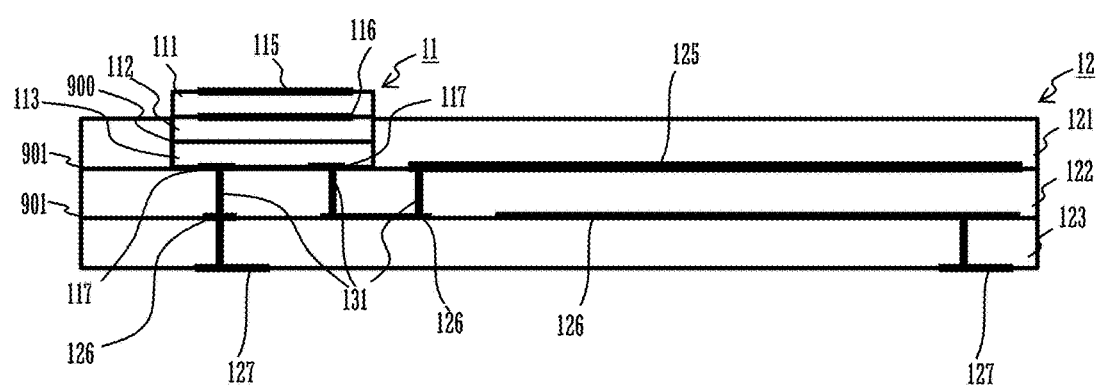

After the resin base materials that constitute the second substrate 12 and the first substrate 11 are stacked, they are heated and pressurized by a heating press, as illustrated in FIG. 4B (this is an example of a second heat and pressure bonding step). In this way, the second substrate 12 is manufactured, and the first substrate 11 and the second substrate 12 are bonded firmly and securely. On the wiring pattern 127 exposed on the lower surface of the resin base material 123, terminals 15 are mounted with, for example, solder.

Since the first substrate 11 and the second substrate 12 are preferably formed by welding the resin base materials made of the same kind of thermoplastic resin, the gap between the first substrate 11 and the second substrate 12 is closed by the resin base materials that flow therein during hot pressing, and boundary surfaces are firmly and securely bonded and combined. Therefore, it is possible to prevent the occurrence of stress and deformation resulting from the difference in linear expansion coefficient between the stacked layers. Hence, it is possible to significantly reduce or prevent peeling from occurring between the resin base materials and on interfaces between the first substrate 11 and the second substrate 12.

When the resin base materials that constitute the second substrate 12 and the first substrate 11 are hot-pressed, the conductive paste 131A in the resin base material 122 is metalized. Hence, the interfaces between the wiring pattern 117 of the first substrate 11 and the via conductors 131 are firmly and securely bonded, and this significantly reduces or prevents peeling.

The multilayer substrate 10 manufactured in the above-described manner is disposed so that first position between first resin base materials coming into contact with each other and a second position between second resin base materials coming into contact with each other are different in the stacking direction. For example, as illustrated in FIG. 4B, the first position 900 between the resin base material 112 and the resin base material 113 in the first substrate 11 is located at almost a middle position in the stacking direction of the resin base material 121 in the second substrate 12, and is different from the second positions 901 between the resin base materials in the second substrate 12.

Since a portion where the position between the layers is different is thus present in the multilayer substrate 10, the flexibility in design is increased. For example, even when there is a portion where wiring is required at a different position in the stacking direction, it is unnecessary to dispose the same resin base material all over the surface (the entire area of the multilayer substrate in plan view) including a portion where wiring is not required.

Further, by adjacently disposing the first substrate 11 and the second substrate 12 made of the same kind of thermoplastic resin, one portion (first substrate 11) of the multilayer substrate 10 is able to be prepared (for example, purchased or manufactured) separately from the other portion (second substrate 12), and is easily combined with the other portion.

Thus, even when there is a need to use a high-accuracy base material (for example, a high-quality resin base material having little variation in thickness and permittivity) in a portion, it is unnecessary to use the high-accuracy base material in the entire multilayer substrate. Further, as described above, wiring patterns are able to be formed in the first substrate 11 and the second substrate 12 by different processes. Even when there is a need to use a high-accuracy process (for example, photolithography) in a portion of the multilayer substrate 10, it is unnecessary to use the high-accuracy process in the entire multilayer substrate 10.

That is, in the other portion where high accuracy is not required, lower-quality resin base materials and an easier process than in the portion where high accuracy is required is able to be used. This significantly reduces the manufacturing cost. For example, if the distance between the layers or the accuracy of wiring patterns differs among individual multilayer substrates, the distance between the wiring patterns or the facing area differs among the individual multilayer substrates, and this causes variation in electric characteristics. In contrast, in the case of the multilayer substrate 10, only in the first substrate 11 in which variation in electric characteristics should be particularly suppressed, high-quality resin base materials having little variation in thickness are preferably used, or wiring patterns are preferably formed by using a high-accuracy process. This prevents increases in the total manufacturing cost of the multilayer substrate 10 while satisfying high accuracy requirement in the portion.

For example, the thicknesses of the wiring pattern 117 and the wiring pattern 125 can be changed in FIG. 4B. Even when the position between the layers is not changed, the thickness of wiring is able to be partly changed. This facilitates manufacturing of multilayer substrates having various wiring structures.

Next, modifications of the multilayer substrate 10 will be described.

Figure 5A:
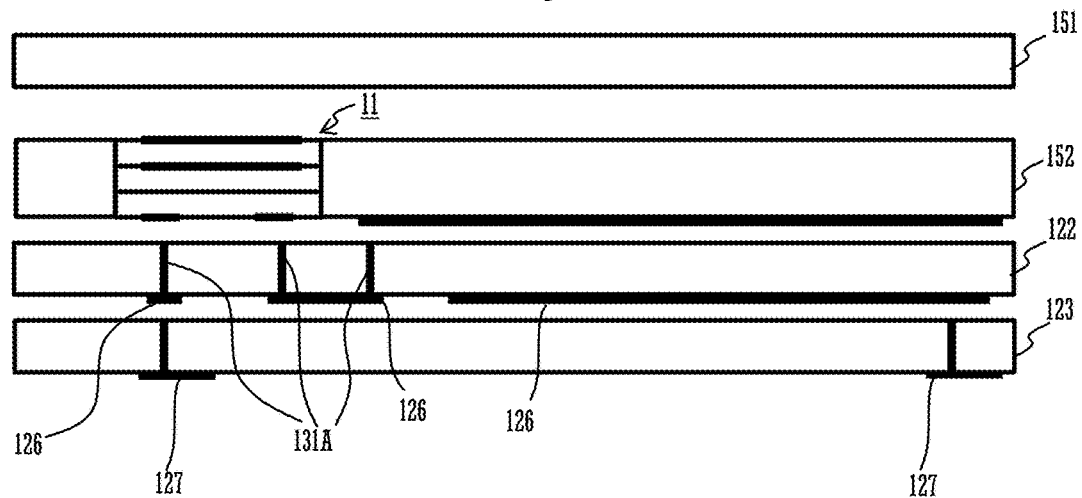
FIGS. 5A and 5B are cross-sectional side views of a multilayer substrate according to a first modification of a preferred embodiment of the present invention.
Figure 5B:
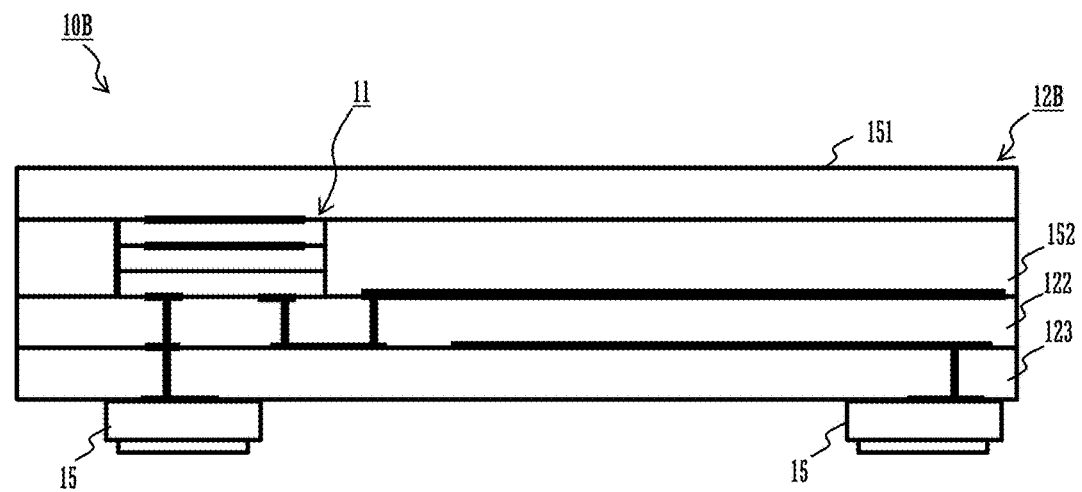

FIG. 5A illustrates a second stacking step in manufacturing of a multilayer substrate 10B according to a first modification of a preferred embodiment of the present invention (an exploded cross-sectional view), and FIG. 5B is a cross-sectional side view illustrating the structure of the multilayer substrate 10B. In FIGS. 5A and 5B, the same structures as those of the multilayer substrate 10 illustrated in FIGS. 4A and 4B are denoted by the same reference numerals, and descriptions thereof are skipped.

In the multilayer substrate 10B, a resin base material 152 to be disposed on an upper surface of a resin base material 122, of resin base materials that constitute a second substrate 12B, and a first substrate 11 are adjacently stacked, and a resin base material 151 is further stacked all over the upper surfaces of the resin base material 152 and the first substrate 11. Thus, the first substrate 11 is encased in the second substrate 12B. In this case, a portion of the resin base material 151 flows in a gap between the first substrate 11 and the second substrate 12B during hot pressing. Hence, boundary surfaces are bonded more firmly and securely. Further, an upper surface of the multilayer substrate 10B can have a flat surface having no irregularities or substantially no irregularities, and this facilitates surface mounting.

Figure 6:
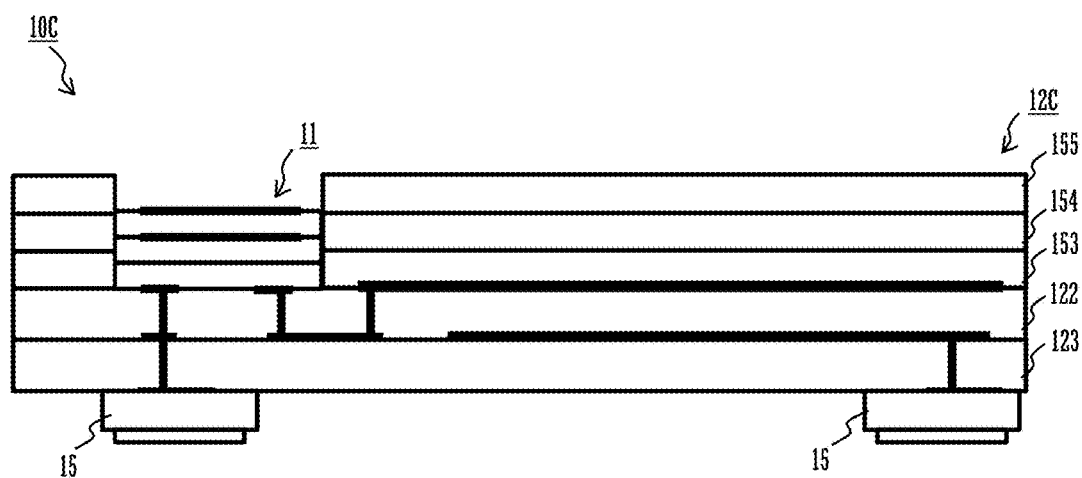
FIG. 6 is a cross-sectional side view of a multilayer substrate according to a second modification of a preferred embodiment of the present invention.

Next, FIG. 6 is a cross-sectional side view illustrating the structure of a multilayer substrate 10C according to a second modification of a preferred embodiment of the present invention. In FIG. 6, the same structures as those of the multilayer substrate 10 illustrated in FIG. 4B are also denoted by the same reference numerals, and descriptions thereof are skipped.

In the multilayer substrate 10C according to the second modification, the stack number of resin base materials that constitute a first substrate 11 is equal to the stack number of resin base materials adjacent to the first substrate 11 (a resin base material 153, a resin base material 154, and a resin base material 155 in order from the lower side) in a second substrate 12C. However, the thickness of the resin base materials that constitute the first substrate 11 and the thickness of the resin base materials of the second substrate 12C adjacent to the first substrate 11 are different. Hence, in the multilayer substrate 10C, the position between the layers is different between first resin base materials that constitute the first substrate 11 and second resin base materials that constitute the second substrate 12C.

In this way, the stack number of resin base materials and the stack number of resin base materials adjacent thereto may be equal or different in a multilayer substrate according to a preferred embodiment of the present invention. When the stack numbers are made different, the minimum necessary stack number for wiring patterns is able to be achieved in each of the first substrate and the second substrate. Hence, the number of portions of connection between the layers is reduced. Further, when an inductor is provided in a portion where the stack number is large, the number of turns of the inductor is able to be increased easily. Even when the stack numbers are equal, the opposed interval between the wiring patterns is able to be made different between the first substrate and the second substrate by making the thickness of the resin base materials different between the first substrate and the second substrate. Thus, for example, when a capacitor is provided in a portion where the opposed interval between the wiring patterns is short, the opposed area is able to be reduced because the opposed interval between the wiring patterns is short. Hence, the capacitor is able to be provided in a smaller space in plan view. In contrast, in a portion where the occurrence of stray capacitance is to be suppressed or prevented, the opposed interval of the wiring patterns is increased by using resin base materials with a large thickness, such that the occurrence of stray capacitance is significantly reduced or prevented.

Figure 7:
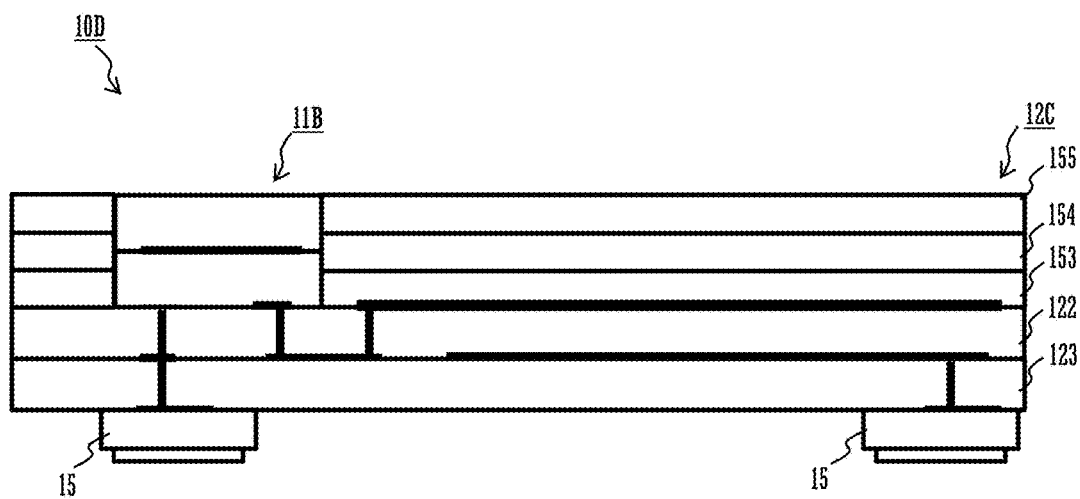
FIG. 7 is a cross-sectional side view of a multilayer substrate according to a third modification of a preferred embodiment of the present invention.

Next, FIG. 7 is a cross-sectional side view illustrating the structure of a multilayer substrate 10D according to a third modification of a preferred embodiment of the present invention. In FIG. 7, the same structures as those of the multilayer substrate 10 illustrated in FIG. 4B are also denoted by the same reference numerals, and descriptions thereof are skipped.

In the multilayer substrate 10D according to the third modification, the stack number of resin base materials that constitute a first substrate 11B is smaller than the stack number of resin base materials in a second substrate 12C adjacent to the first substrate 11B (a resin base material 153, a resin base material 154, and a resin base material 155 in order from the lower side).

In the multilayer substrate 10D, the position between the layers is also different between first resin base materials that constitute the first substrate 11B and second resin base materials that constitute the second substrate 12C.

In this way, a multilayer substrate according to a preferred embodiment of the present invention may be such that the stack number of resin base materials is smaller in the first substrate.

Figure 8A:
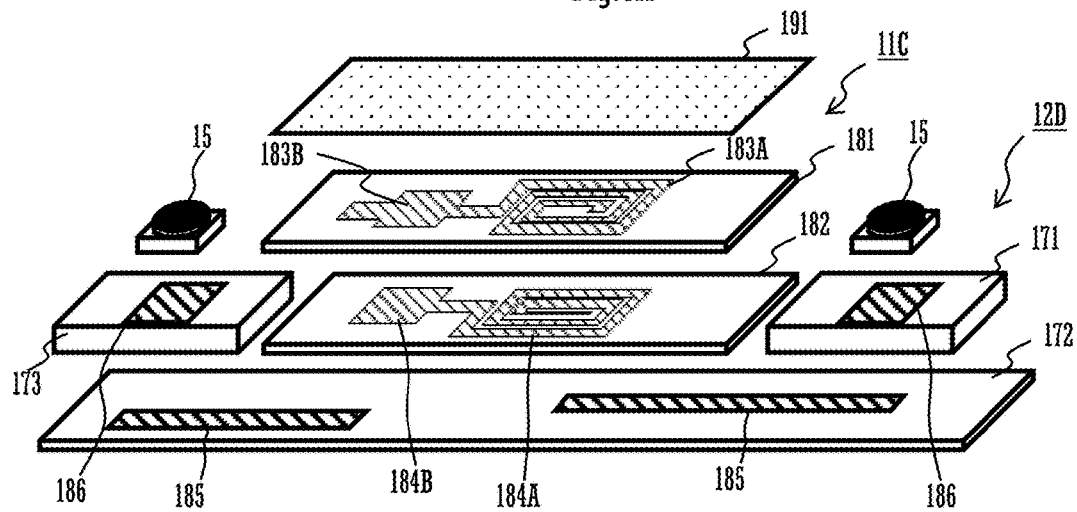
FIGS. 8A, 8B, and 8C are an exploded perspective view, a cross-sectional side view, and an equivalent circuit diagram, respectively, of a multilayer substrate in which a first substrate defines a high-frequency circuit according to a preferred embodiment of the present invention.
Figure 8B:
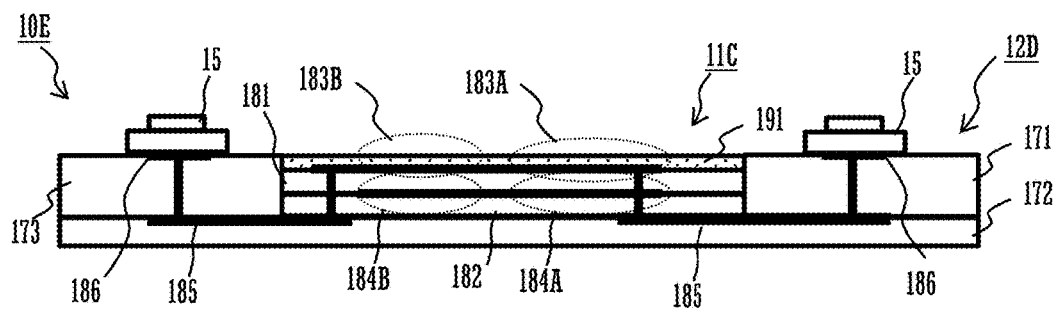
Figure 8C:
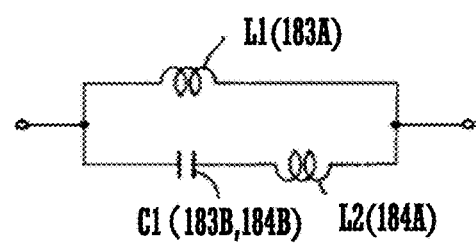

FIGS. 8A, 8B, and 8C are an exploded perspective view, a cross-sectional side view, and an equivalent circuit diagram, respectively, of a multilayer substrate in which a first substrate constitutes a high-frequency circuit.

A multilayer substrate 10E of this example includes a first substrate 11C, a second substrate 12D, and terminals 15.

The first substrate 11C defines a portion of a high-frequency filter circuit. In the first substrate 11C, a resin base material 181, a resin base material 182, and a resist layer 191 are stacked in order from a lower side. The uppermost layer may be a resin base material instead of the resist layer 191. In the second substrate 12D, a resin base material 171 and a resin base material 173 are stacked on an upper surface of a resin base material 172. The resin base material 171 and the resin base material 173 are stacked on longitudinal end portions of the upper surface of the resin base material 172.

The first substrate 11C is stacked on the longitudinal center of the upper surface of the resin base material 172. The terminals 15 are disposed near longitudinal end portions of an upper surface of the second substrate 12D.

In this example, first, a resin base material 181 and a resin base material 182 are stacked and hot-pressed to manufacture a first substrate 11C. After that, the first substrate 11C, a resin base material 171, and a resin base material 173 are adjacently stacked on an upper surface of a resin base material 172 of a second substrate 12D, and are hot-pressed to manufacture a multilayer substrate 10E. A resist layer 191 may be formed when manufacturing the first substrate 11C, or may be formed in a final step.

On an upper surface of the resin base material 181 of the first substrate 11C, a wiring pattern 183A for an inductor L1 illustrated in the equivalent circuit diagram of FIG. 8C is provided, and a wiring pattern 183B for a capacitor C1 is also provided. On an upper surface of the base resin material 182, a wiring pattern 184A for an inductor L2 in the equivalent circuit diagram of FIG. 8C is provided, and a wiring pattern 184B for the capacitor C1 is also provided. Further, wiring patterns 185 are provided on an upper surface of the resin base material 172 in the second substrate 12D, and wiring patterns 186 are provided on upper surfaces of the resin base material 171 and the resin base material 173. These wiring patterns are electrically joined through via conductors, such that a high-frequency filter circuit illustrated in the equivalent circuit diagram of FIG. 8C is configured.

When the high-frequency circuit including the inductor, the capacitor and so on is thus configured in a portion of the multilayer substrate, if the distance between the layers differs among the components or the wiring patterns provided on the resin base materials have different areas, the characteristics of the filter circuit vary among the components. To suppress or prevent variation in the distance between the layers, for example, high-accuracy (high-quality) resin base materials having little variation in thickness preferably are prepared. To suppress or prevent the variation in the area of wiring patterns, a high-accuracy process (for example, photolithography) is preferably used.

In this example, for the first substrate 11C, high-accuracy (high-quality) resin base materials having little variation in thickness are preferably prepared, and a high-accuracy process (for example, photolithography) is preferably used. For the second substrate 12D, low-accuracy (low-quality) resin base materials having relatively great variation in thickness are preferably prepared, and a relatively low-accuracy process (for example, screen printing) is preferably used. Therefore, it is unnecessary to prepare high-quality resin base materials having little variation in thickness and permittivity and to use a high-accuracy process in the entire multilayer substrate. This prevents the increase in manufacturing cost.

While the base materials and processes having different accuracies are used for the first substrate and the second substrate in the above-described preferred embodiment, the present invention is not limited thereto. In the present invention, base materials and processes having the same accuracy may be used for the first substrate and the second substrate.

In a multilayer substrate according to a preferred embodiment of the present invention, even when wiring patterns are more densely provided in the stacking direction only in one portion than in the other portion, it is possible to prevent the stack number from increasing more than necessary in the other portion. This point will be described in conjunction with a multilayer substrate 10F according to a fourth modification of a preferred embodiment of the present invention illustrated in FIGS. 9A and 9B.

Figure 9A:
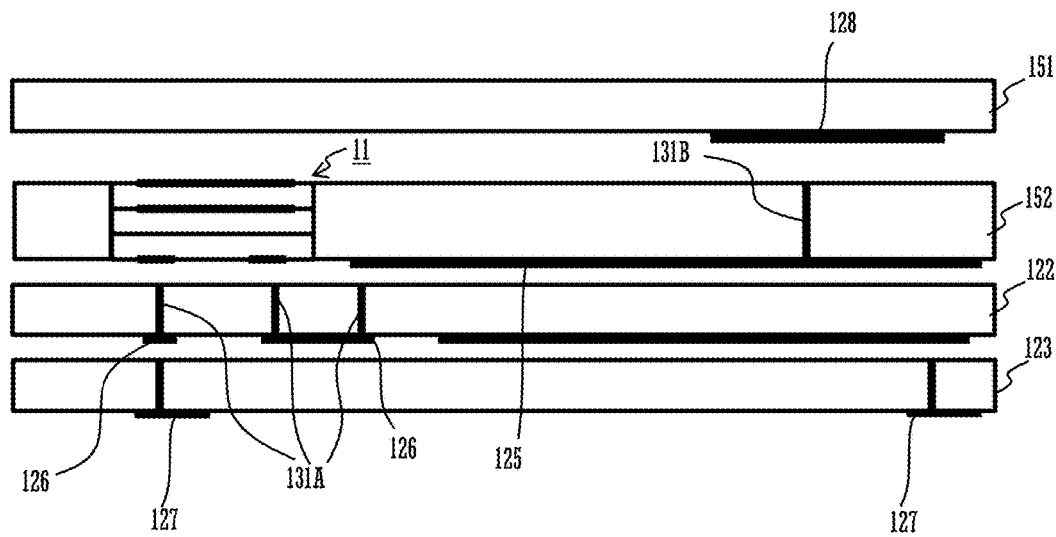
FIGS. 9A and 9B are cross-sectional side views of a multilayer substrate according to a fourth modification of a preferred embodiment of the present invention.
Figure 9B:
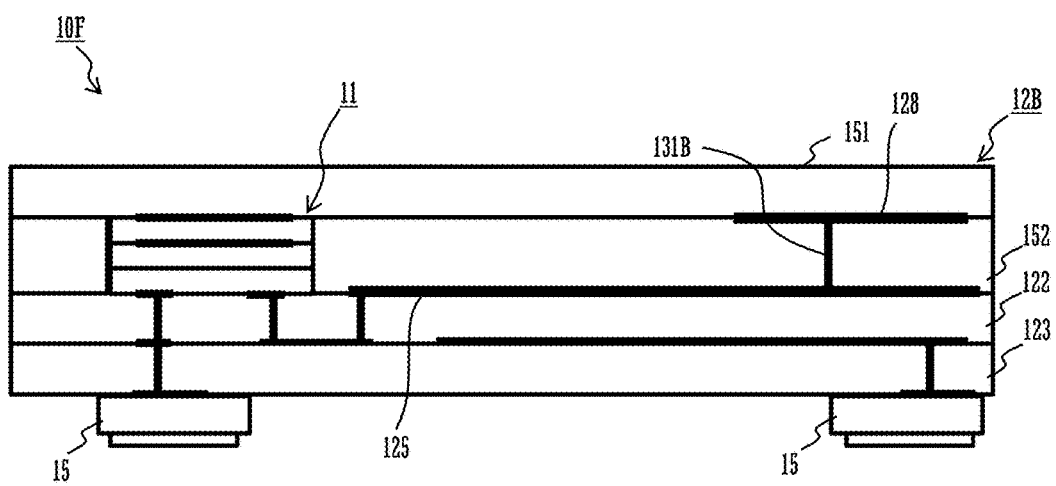

FIG. 9A is an exploded cross-sectional view of the multilayer substrate 10F according to the fourth modification, and FIG. 9B is a cross-sectional side view of the multilayer substrate 10F. The same structures as those of the multilayer substrate 10B illustrated in FIGS. 5A and 5B are denoted by the same reference numerals, and descriptions thereof are skipped. In the multilayer substrate 10F, a wiring pattern 128 present on a lower surface of a resin base material 151 is connected to a wiring pattern 125 present on an upper surface of a resin base material 152. As illustrated in FIGS. 9A and 9B, even when there is a need to connect wiring patterns provided on the upper side and the lower side of a first substrate 11, in the multilayer substrate 10F, it is only necessary to provide a via conductor 131B in one layer, that is, the resin base material 152 of a second substrate 12B adjacent to the first substrate 11 to connect the via conductor 131B and the wiring pattern 128. Therefore, according to a multilayer substrate according to a preferred embodiment of the present invention, the number of connecting portions using via conductors is prevented from increasing more than necessary. As a result, the decrease in conductivity of connection between the layers is significantly reduced or prevented.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. A multilayer substrate comprising:
    a stack of a plurality of resin base materials made of a same kind of thermoplastic resin;
    a first substrate including a plurality of first resin base materials of the plurality of resin base materials; and
    a second substrate including a plurality of second resin base materials of the plurality of resin base materials; wherein
    the first substrate and the second substrate are adjacently disposed at a same position in a stacking direction of the plurality of resin base materials;
    a first position between first resin base materials in contact with each other and a second position between second resin base materials in contact with each other are different in the stacking direction;
    a side surface and a bottom surface of the first substrate are directly welded to the second substrate; and
    all boundary surfaces between the first substrate and the second substrate are directly welded and directly combined with each other without interposing another resin.

2. The multilayer substrate according to claim 1, wherein a stack number of the plurality of first resin base materials is different from a stack number of the second resin base materials adjacent to the first substrate, of the plurality of second resin base materials.

3. The multilayer substrate according to claim 1, wherein the first substrate is encased in the second substrate.

4. The multilayer substrate according to claim 1, wherein the first substrate and the second substrate are electrically joined through a via conductor.

5. The multilayer substrate according to claim 1, wherein the first substrate defines at least a portion of a high-frequency filter circuit.

6. The multilayer substrate according to claim 1, wherein the thermoplastic resin is one of a liquid crystal polymer resin, a polyetheretherketone, a polyetherimide, a polyphenylenesulfide, and a polyimide.

7. The multilayer substrate according to claim 1, wherein a gap is provided between the first substrate and the second substrate, and a resin base material is filled in the gap.

8. The multilayer substrate according to claim 1, wherein an upper surface of the multilayer substrate has a flat surface with no irregularities or substantially no irregularities.

9. The multilayer substrate according to claim 1, wherein a thickness of the resin base materials that constitute the first substrate and a thickness of the resin base materials of the second substrate are different.

10. The multilayer substrate according to claim 1, wherein a stack number of the resin base materials that constitute the first substrate is smaller than a stack number of the resin base materials in the second substrate.

* * * * *